(12) United States Patent
Wohlmuth

(10) Patent No.: US 7,655,546 B2
(45) Date of Patent: Feb. 2, 2010

(54) MONOLITHIC INTEGRATED ENHANCEMENT MODE AND DEPLETION MODE FIELD EFFECT TRANSISTORS AND METHOD OF MAKING THE SAME

(75) Inventor: Walter Anthony Wohlmuth, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 11/248,935

(22) Filed: Oct. 11, 2005

(65) Prior Publication Data
US 2006/0027840 A1 Feb. 9, 2006

Related U.S. Application Data

(62) Division of application No. 10/721,437, filed on Nov. 24, 2003.

(51) Int. Cl.
*H01L 27/02* (2006.01)
*H01L 31/072* (2006.01)

(52) U.S. Cl. .................. 438/576; 438/167; 438/172; 438/570; 438/572; 438/573; 257/155; 257/191; 257/192; 257/E27.068; 257/E29.041

(58) Field of Classification Search ............ 438/172, 438/167, 573, 576; 257/155, 191, 192, 260, 257/392
See application file for complete search history.

(56) References Cited

U.S. PATENT DOCUMENTS 4,849,368 A * 7/1989 Yamashita et al. .......... 438/172

| | | |
|---|---|---|
| 5,116,774 A | 5/1992 | Huang et al. |
| 5,243,207 A | 9/1993 | Plumton et al. |
| 5,389,554 A | 2/1995 | Liu et al. |
| 5,569,944 A | 10/1996 | Delaney et al. |
| 5,596,211 A | 1/1997 | Onda et al. |

(Continued)

FOREIGN PATENT DOCUMENTS

JP 06120258 4/1994

OTHER PUBLICATIONS

Toyoda et al., "An application of Pt-GaAs reaction to GaAs ICs," Inst. Phys. Conf. Ser. No. 63, Chapter 11, pp. 521-526 (1981).

(Continued)

*Primary Examiner*—Dao H Nguyen
(74) *Attorney, Agent, or Firm*—Bever, Hoffman & Harms, LLP

(57) ABSTRACT

A depletion mode (D-mode) field effect transistor (FET) is monolithically integrated with an enhancement mode (E-mode) FET in a multi-layer structure. The multi-layer structure includes a channel layer overlaid by a barrier layer overlaid by an ohmic contact layer. Source and drain contacts of the D-mode and E-mode FETs are coupled to the ohmic contact layer. A gate contact of the D-mode and E-mode FETs is coupled to the barrier layer. An amorphized region is provided beneath the E-mode gate contact within the barrier layer. The amorphized region forms a buried E-mode Schottky contact with the barrier layer. An alternative embodiment couples the gate contact of the D-mode transistor to a first layer that overlies the barrier layer, and provides a similar D-mode amorphized region within the first layer.

7 Claims, 13 Drawing Sheets

U.S. PATENT DOCUMENTS

| | | |
|---|---|---|
| 6,034,386 A | 3/2000 | Ando |
| 6,078,067 A | 6/2000 | Oikawa |
| 6,144,048 A | 11/2000 | Suemitsu et al. |
| 6,166,404 A * | 12/2000 | Imoto et al. .................. 257/279 |
| 6,194,747 B1 | 2/2001 | Onda |
| 6,242,293 B1 | 6/2001 | Danzilio |
| 6,258,639 B1 | 7/2001 | Rohdin et al. |
| 6,307,221 B1 | 10/2001 | Danzilio |
| 6,452,221 B1 | 9/2002 | Lai et al. |
| 6,521,961 B1 | 2/2003 | Costa et al. |
| 6,555,850 B1 | 4/2003 | Sakamoto et al. |
| 6,593,603 B1 | 7/2003 | Kim et al. |
| 6,620,662 B2 | 9/2003 | Hoke et al. |
| 6,670,652 B2 * | 12/2003 | Song .......................... 257/194 |
| 2002/0171076 A1 | 11/2002 | Danzilio |

OTHER PUBLICATIONS

Schulz et al., "Morphological Development During Platinum/Gallium Arsenide Interfacial Reactions," J. of Elect. Mat., 19, #6, pp. 581-589 (1990).

Ko, Dae-Hong and Robert Sinclair, "In-situ dynamic high-resolution transmission electron microscopy: application to Pt/GaAs interfacial reactions," Ultramicroscopy, 54, pp. 166-178 (1994).

Saka et al., "Low Standby Leakage Current Power Amplifier Module Made with Junction PHEMT Technology," 25$^{th}$ IEEE GaAs IC Symposium Technical Digest, pp. 301-304 (2003).

* cited by examiner

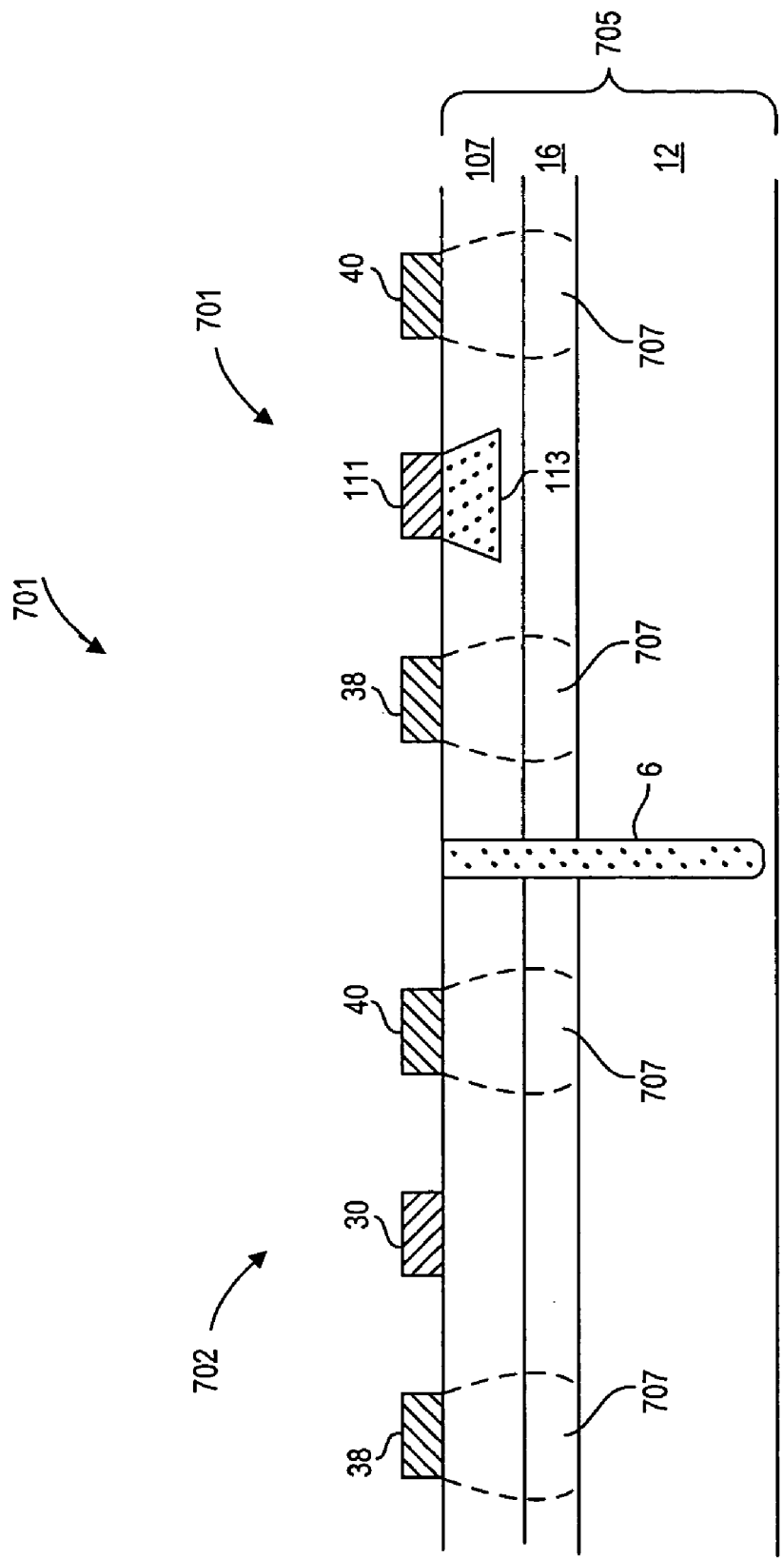

US 7,655,546 B2

MONOLITHIC INTEGRATED ENHANCEMENT MODE AND DEPLETION MODE FIELD EFFECT TRANSISTORS AND METHOD OF MAKING THE SAME

RELATED APPLICATION

The present application is a divisional of U.S. patent application Ser. No. 10/721,437 filed by Walter Anthony Wohlmuth on Nov. 24, 2003.

BACKGROUND OF THE INVENTION

1. Field of the Invention

The present invention is in the field of integrated circuits, and in particular involves field effect transistors.

2. Description of the Related Art

A type of semiconductor transistor known as a field effect transistor, or FET, includes three terminals: (1) a source; (2) a drain; and (3) a gate. When a threshold voltage is applied to the gate, a "field effect" takes place in a region of semiconductor material under the gate, called the "gate region." The effect is either a build up of charge or a depletion of charge in the gate region. Which event occurs depends on the doping conductivity type of the gate region and the polarity of the gate voltage. The build up or depletion of charges creates a channel under the gate that electrically connects the source and the drain. If a channel is present while the drain region is biased with a voltage, and the source region is grounded relative to the drain region, then a current will flow through the channel between the drain and source regions.

Among the various types of FETs are enhancement mode (E-mode) and depletion mode (D-mode) transistors. An E-mode transistor is non-conductive when the gate voltage is zero or negative. For this reason, an E-mode transistor is classified as a "normally off" transistor. An E-mode transistor is driven into conduction by bringing the gate voltage positive with respect to the source voltage. In a D-mode transistor, by contrast, there is conduction even with zero gate voltage, provided that the drain region is biased with a voltage, and the source region is grounded relative to the drain region. For this reason, D-mode transistors are classified as "normally-on" transistors. A D-mode transistor is made non-conductive by bringing the gate voltage negative with respect to the source voltage.

One type of FET that is useful for high frequency applications is high electron mobility transistor (HEMT). HEMT devices may be formed as either enhancement mode or depletion mode devices, and often are formed from Group III-V materials, such as gallium arsenide (GaAs) and indium phosphide (InP).

Generally, a HEMT includes a channel layer that is overlaid by a spacer layer that is overlaid by a barrier layer. The spacer and barrier layers are formed of a wide band gap semiconductor material. The channel layer is formed of a narrow band gap semiconductor material. Due to the conduction band discontinuity at the junction between these dissimilar semiconductor materials, which is called a "heterojunction," electrons are injected from the barrier layer into the channel layer during operation of the transistor. The electrons are confined to move in a plane parallel to the heterojunction due to the relatively wider bandgap of the barrier layer. The electrons move more easily through the channel layer of a HEMT device than through the channel of an ordinary FET. As a result, HEMT devices can operate at high speed and low noise levels.

In certain applications, it is desirable to form semiconductor devices, such as direct-coupled FET logic devices, that monolithically integrate a D-mode transistor with an E-mode transistor in a single integrated circuit. FIG. 1 discloses a conventional monolithically integrated D-mode/E-mode transistor device 1 that includes a D-mode transistor 2 that is monolithically integrated with an E-mode transistor 3 in a multi-layer structure 5. In this particular example, each of the D-mode and E-mode transistors 2, 3 are a type of HEMT known as a pseudo-morphic high-electron mobility transistor, or pHEMT. While the D-mode transistor 2 and the E-mode transistor 3 are shown as being laterally adjacent to each other for ease of view, the D-mode and E-mode transistors 2, 3 may be disposed away from each other in different regions of the integrated circuit.

Multi-layer structure 5 includes a semiconductor substrate 10 that is formed of undoped GaAs. Disposed in successive layers over semiconductor substrate 12 are various epitaxial semiconductor layers, including: a buffer layer 14; channel and spacer layers 16; an E-mode barrier layer 18; an E-mode etch stop layer 20; a D-mode barrier layer 22; a D-mode etch stop 24; a wide recess transition layer 26; and an ohmic contact layer 28. Note that there are two barrier layers and two etch stop layers.

The D-mode transistor 2 and the E-mode transistor 3 each include a metal source contact 38 and a metal drain contact 40 on an upper surface of the ohmic contact layer 28. Each transistor 2, 3 is electrically isolated within a respective hollow column of implanted ions, depicted as isolation region 6, that surrounds the respective transistor 2, 3. The sidewall of the respective isolation region 6 around each transistor 2, 3 extends downward from the upper surface of ohmic contact layer 28 through the buffer layer 14.

Laterally between the source and drain terminals 38, 40 of both of the D-mode and E-mode transistors 2, 3 is a metal gate contact of the respective transistor 2, 3. The D-mode and E-mode gate contacts 30, 34 are disposed in respective D-mode and E-mode gate recesses 32, 36 that extend into multi-layer substrate 5 from the upper surface of ohmic contact layer 90. The D-mode and E-mode gate contacts 30, 34 are coupled to different ones of the interior semiconductor layers of multi-layer structure 5 at points vertically below the ohmic contact layer 90.

In particular, the D-mode gate contact 30 of D-mode transistor 2 is coupled to an upper surface of D-mode barrier layer 22 within the D-mode gate recess 32. The semiconductor sidewall 33 of the D-mode gate recess 32 tapers inwardly going from the upper surface of ohmic contact layer 28 downward toward D-mode barrier layer 22. In addition, the sidewall 33 is stepped, so as to form a wide recess ledge 46 at the upper surface of wide recess transition layer 26. The presence of the wide recess ledge 46 is included to enhance the breakdown voltage of the D-mode transistor 2.

Similarly, the metal gate contact 34 of E-mode transistor 3 is coupled to an upper surface of E-mode barrier layer 18 within the E-mode gate recess 36. The semiconductor sidewall 37 of the E-mode gate recess 36 also tapers inwardly going from the upper surface of ohmic contact layer 28 downward toward the D-mode barrier layer 22. In addition, the sidewall 37 is stepped, so as to form a wide recess ledge 46 at the upper surface of wide recess transition layer 26. The presence of the wide recess ledge 46 is included to enhance the breakdown voltage of the E-mode transistor 3.

As shown in FIG. 1, the E-mode gate recess 36 and the E-mode gate contact 34 extend vertically deeper into multi-layer structure 5 than the D-mode gate recess 32 and D-mode gate contact 30, because the E-mode barrier layer 28 to which the E-mode gate contact 34 is coupled vertically below the D-mode barrier layer 22 and the E-mode etch stop layer 20.

To form the stepped D-mode gate recess 32, a plurality of photolithography and etch steps are required, including: (1) a first selective etch step that etches the ohmic contact layer 28 through a first photoresist mask and stops on wide recess transition layer 26; (2) a second selective etch step that etches the wide recess transition layer 26 through a second photoresist mask and stops on D-mode etch stop layer 24; and (3) a third selective etch step that etches the D-mode etch stop layer 24 through the second photoresist mask and stops on D-mode barrier layer 22.

Likewise, a plurality of photolithography and etch steps are required to form the E-mode gate recess 36, including: (1) a first selective etch step that etches the ohmic contact layer 28 through a first photoresist mask and stops on wide recess transition layer 26; (2) a second selective etch step that etches wide recess transition layer 26 through a second photoresist mask and stops on D-mode etch stop layer 24; (3) a third selective etch step that etches D-mode etch stop layer 24 through the second photoresist mask and stops on D-mode barrier layer 22; (4) a fourth selective etch step that etches the D-mode barrier layer 22 through the second photoresist mask and stops on E-mode etch stop layer 20; and (5) a fifth selective etch step that etches the E-mode etch stop layer 20 through the second photoresist mask and stops on E-mode barrier layer 18.

The gate contacts 30, 34 of the D-mode and E-mode transistors 2, 3, respectively, have the same structure, and consist of several successive metal layers, including: (1) a thin first layer of titanium (Ti) in contact with the surface of barrier layers 22, 18, respectively; (2) a thin second layer of platinum (Pt) on the Ti layer; and (3) a relatively-thick layer of gold (Au) on the Pt layer. The source and drain contacts 38, 40 also are formed of several successive metal layers, including: (1) a first layer of Au in contact with the upper surface of ohmic contact layer 28; (2) a second layer of nickel (Ni) on the Au layer; (3) a third layer of germanium (Ge) on the Ni layer; and (4) a fourth layer of Au on the Ge layer.

The D-mode and E-mode gate recesses 32, 36 are typically filled with a dielectric material around the metal gate contacts 30, 34. The dielectric material may be silicon dioxide or silicon nitride. Metal interconnects are coupled to the top surface of the gate contacts 30, 34, the source contacts 38, and the drain contacts 40 to complete the D-mode and E-mode transistors 2, 3.

The conventional monolithic integrated E-mode/D-mode transistor device 1 of FIG. 1 has several problematic aspects. First, the multi-layer structure 5 includes a multiplicity of semiconductor layers, including two etch stop layers 20, 24 and two barrier layers 18, 22. The greater the number of layers, the greater the cost and complexity of the multi-layer structure 5. This leads to additional cost and complexity in the transistor fabrication process. For instance, the process for forming the E-mode gate recess 36 of FIG. 1 involves at least five selective etch steps.

In addition, the E-mode etch stop layer 20, which is necessary to the making of E-mode transistor 3, is beneath the D-mode gate contact 30 and barrier layer 22 of the D-mode transistor 2. Because manufacturing tolerances related to the thickness of the various epitaxial layers of the multi-layer structure 5 are up to 5% for a given epitaxial vendor and epitaxial growth machine, the structure of the multi-layer structure 5 beneath D-mode transistor 2 is variable. Unfortunately, such variations in the placement of E-mode etch stop layer 20 will lead to variability in the performance of the D-mode transistor 2 from wafer to wafer. In addition, the presence of the E-mode etch stop layer 24 beneath the D-mode gate contact 30 can also lead to other undesirable conditions, such as interfacial defects, interface roughness, non-uniformity, conduction and valence band offsets, and different material resistivities. These conditions also will degrade the performance of the D-mode transistor 2.

The performance of the E-mode transistor 3 also is compromised in the conventional design. For instance, a certain degree of overetch is required to ensure that the E-mode etch stop layer 20 is reached during the step of etching through D-mode barrier layer 22. During the overetching step, etching in the vertical direction proceeds slowly because of the selectivity of the etchant to E-mode etch stop layer 20. On the other hand, etching in the lateral direction through the D-mode barrier layer 22 proceeds unabated. As a result, the perimeter of the partially-completed E-mode gate recess 36 at the exposed surface of the E-mode etch stop layer 20 is greater than desired. The subsequent etch step that etches through E-mode etch stop layer 50 therefore exposes a larger-than-desired area of the upper surface of E-mode barrier layer 18. Since the E-mode gate contact 34 only partially covers the exposed upper surface of the E-mode barrier layer 18 within E-mode gate recess 36, an ungated region 44 on the surface of E-mode barrier layer 18 is formed. Control of the extent of the ungated region 44 is difficult due to variations in the epitaxial layer thicknesses and etch dependencies on the feature size.

The relatively-large surface area of the semiconductor sidewall 37 and ungated region 44 of the E-mode gate recess 36 is problematic. These surfaces, which are covered by a native oxide due to exposure to the air, possess interface traps and defects due to the abrupt termination of the regular crystal lattice, which in turn causes dangling bonds, defects, and surface states to form. The surface states will deplete the underlying semiconductor material of charge carriers, and can effectively cause the E-mode transistor 3 to be permanently off irrespective of the gate voltage applied to the E-mode gate contact 34.

Accordingly, a new approach to achieving a monolithically integrated D-mode/E-mode FET device is desirable.

SUMMARY

The present invention includes monolithically integrated D-mode/E-mode FET devices, and methods of making such devices.

In one embodiment, a monolithically integrated D-mode/E-mode FET device includes a D-mode transistor and an E-mode transistor in a substrate. The substrate includes a plurality of semiconductor layers, including a channel layer overlaid by a barrier layer that is overlaid by an etch stop layer that is overlaid by an ohmic contact layer. Source and drain contacts of the D-mode and E-mode transistors are coupled to the ohmic contact layer. Gate contacts of the D-mode and E-mode transistors are coupled to an upper surface of the barrier layer. Beneath the E-mode gate contact and within the barrier layer is an amorphized region that includes at least one layer of an electrically conductive compound formed by a diffusion of a metal layer into the semiconductor of the barrier layer. The amorphized region forms a Schottky contact with underlying semiconductor portions of the barrier layer.

Accordingly, the monolithically integrated D-mode/E-mode FET device of this example that includes a single barrier layer, to which both the D-mode and E-mode gate contacts are coupled, and a single etch stop layer. The structure of the multi-layer substrate therefore is simplified, rendering the making of the transistors easier and less expensive. Moreover, the performance of the D-mode and E-mode transistors is improved. The D-mode transistor is more reliable and repeatable that in the conventional device, because the E-mode specific etch stop layer and barrier layer that were under the D-mode gate contact and D-mode barrier layer of the conventional device are eliminated. The E-mode transistor performance is improved because the Schottky contact between the E-mode gate contact and the semiconductor material of the barrier layer is buried beneath the upper surface of the barrier layer. This significantly reduces the risks posed by dangling bonds, defects, and surface states in the ungated region and gate recess sidewalls.

In an alternative embodiment, the D-mode transistor's gate contact is not coupled to the same barrier layer to which the E-mode gate contact is coupled, but rather is coupled to an overlying semiconductor layer. The D-mode contact is, like the E-mode gate contact, formed in a manner that allows an initial metal layer of the D-mode gate contact to diffuse into the semiconductor layer, thereby forming a D-mode amorphization region that provides a Schottky contact with underlying portions of the semiconductor layer. This embodiment also improves on the conventional structure provided above, because it reduces the risks posed by dangling bonds, defects, and surface states in the ungated region and gate recess sidewalls.

These and other aspects of the present invention may be better understood by reference to the following detailed description of the exemplary embodiments, when read in conjunction with the accompanying drawings thereof.

BRIEF DESCRIPTION OF THE DRAWINGS

FIG. 7 is a simplified cross-sectional side view of another embodiment of a monolithically integrated D-mode/E-mode FET device in accordance with the present invention.

Like features appearing in more than one figure are given the same reference numbers where possible, and redundant discussion thereof typically is omitted.

DETAILED DESCRIPTION

The present invention includes an integrated circuit that includes both D-mode and E-mode FETs, and a method of making the integrated circuit. The monolithically integrated D-mode and E-mode FETs formed in accordance with the present invention may be, for instance, pseudo-morphic high-electron mobility transistors (pHEMTs), high-electron mobility transistors (HEMTs), modulation-doped field effect transistors (MODFETs), meta-morphic high-electron mobility transistors (mHEMTs), heterojunction-insulated gate FETs (HIGFETs), and heterojunction field-effect transistors (HFET). Such devices may be formed, for instance, using a GaAs-based (gallium arsenide) material system (GaAs, AlGaAs, InGaAs, AlAs, InGaAlAs, InGaP, InGaNP, AlGaSb, etc.), an InP-based (indium phospide) material system (InP, InAlP, InGaP, InGaAs, InAlAs, InSb, InAs, etc.), a Si and Ge-based (silicon and germanium) material system (Si, Ge, SiGe, SiGeC, SiO2, SiC, sapphire, etc.), or a GaN-based (gallium nitride) material system (GaN, AlGaN, InGaN, InAlGaN, SiC, Si, sapphire, etc.), among other possibilities.

Figure 2:
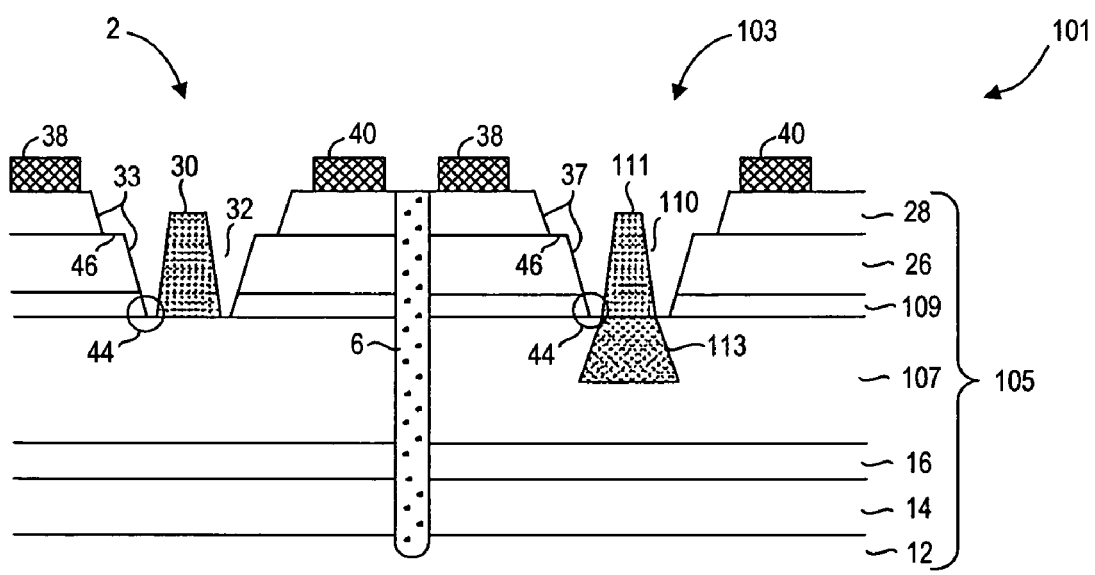
FIG. 2 is a simplified cross-sectional side view of an embodiment of a monolithically integrated D-mode/E-mode FET device in accordance with the present invention.

FIG. 2 illustrates a first embodiment of a monolithically integrated D-mode and E-mode FET device 101 in accordance with the present invention. In this particular example, the D-mode and E-mode transistors 2, 103 of FIG. 2 are pHEMTs that are formed in a multi-layer structure 105. While the D-mode transistor 2 is shown laterally adjacent to the E-mode transistor 103, the two transistors need not be laterally adjacent, but rather may be disposed in different regions of the device 101, which is a single integrated circuit. A respective isolation region 6 isolates the D-mode transistor 2 and the E-mode transistor 103.

Figure 1:
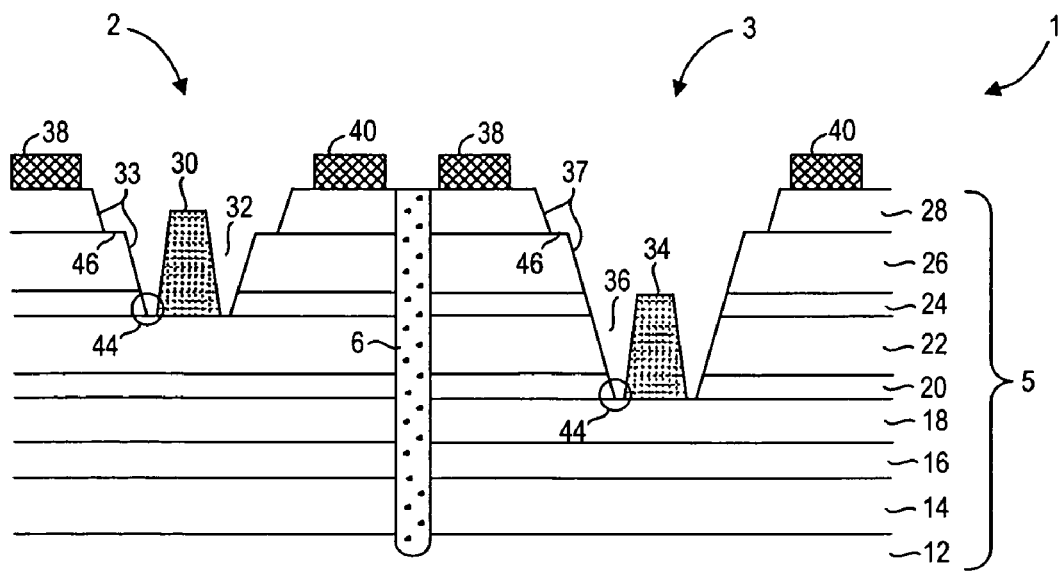
FIG. 1 is a simplified cross-sectional side view of a conventional monolithically integrated D-mode/E-mode FET device.

The monolithically integrated D-mode/E-mode FET device 101 of FIG. 2 differs from the conventional monolithically integrated D-mode/E-mode FET device 1 of FIG. 1 by, for instance, including only a single etch stop layer 109 and a single barrier layer 107 within multi-layer structure 105, rather than having the two etch stop layers 20, 24 and the two barrier layers 18, 22 of the conventional structure of FIG. 1. Elimination of the E-mode etch stop layer 20 that formerly was beneath the D-mode gate contact 30 and the D-mode barrier layer 22 (FIG. 1) resolves the aforementioned performance problems of the D-mode transistor 2 associated with varying layer thicknesses. Moreover, the complexity and cost of the multi-layer structure 105, and the number of etch processes required to form the E-mode gate recess 36 of the monolithically integrated D-mode/E-mode FET device 101 of FIG. 2 are decreased relative to those of the conventional device of FIG. 1.

The reduction in the number of semiconductor layers of the multi-layer structure 105 of the monolithically integrated D-mode/E-mode FET device 101 is achieved in part by using a different set of metal layers in the E-mode gate contact 111 of FIG. 2 than was used in the E-mode gate contact 34 of FIG. 1. As is explained in greater detail below, the E-mode gate contact 111 is constructed such that the initial metal layer placed in contact with the exposed upper surface of barrier layer 107 within E-mode gate recess 110 diffuses into the semiconductor material of barrier layer 107 in a controllable and uniform manner, forming an amorphized region 113. As the material of this initial metal layer diffuses into barrier layer 107, a solid state interaction occurs to form small-grain-sized, uniformly stratified, electrically-conductive, elemental compound layers that form a Schottky contact with the semiconductor material of barrier layer 107. This diffusion-assisted amorphization technique overcomes the aforementioned difficulties with the ungated region 44 and E-mode recess semiconductor sidewall 37 of E-mode transistor 3 of FIG. 1, since the interface between the amorphized region 113 and the barrier layer 107 is buried in the multi-layer substrate 105. Therefore, the detrimental surface effects that may be expected to arise from the ungated region 44 and the E-mode gate recess sidewall 37 of the E-mode transistor 103 of FIG. 2 are much reduced relative to the E-mode transistor 3 of FIG. 1, enabling a robust and repeatable E-mode transistor 103 to be realized. The control of the depth of the amorphized material of amorphized region 113 is dependent on the type and thickness of the first-deposited metallic layer that undergoes the amorphization, and on the process parameters used to initiate, drive, and complete the reactions.

An exemplary method of making the monolithically integrated D-mode/E-mode FET device 101 of FIG. 2 begins with provision of an unpatterned wafer including multi-layer structure 105. The multi-layer structure 105 includes a semiconductor substrate overlaid by a plurality of epitaxial semiconductor layers. The multi-layer structure 105 may be formed of semiconductor materials within the various material systems mentioned above. The number and types of epitaxial layers may vary. The epitaxial layers may be grown using conventional molecular beam epitaxy (MBE) and metallorganic chemical vapor deposition (MOCVD) methods.

For the sake of example, we will discuss a multi-layer substrate 105 that is within the GaAs-based material system. In one embodiment, the semiconductor substrate 12 of multi-layer structure 105 is composed of undoped GaAs. The buffer layer 14 is grown on the upper surface of the substrate 12. The buffer layer 14 may be composed of an initial bulk GaAs material layer on top of the substrate 12, followed by an optional superlattice of alternating GaAs and $Al_{(x)}Ga_{(1-x)}As$ material layers. Within the buffer layer 14, the bulk GaAs layer may have a thickness (i.e., a vertical height in FIG. 2) that ranges between 100 to 10,000 Å. The respective GaAs layers within the superlattice may have a thickness ranging between 15 to 500 Å. The respective $Al_{(x)}Ga_{(1-x)}As$ layers within the superlattice also may have a thickness ranging between 15 to 500 Å. The $Al_{(x)}Ga_{(1-x)}As$ layers can have an (x) range from 0.0 to 0.5. Within the buffer layer 14, the alternating GaAs and $Al_{(x)}Ga_{(1-x)}As$ layers may be repeated 5 to 50 times. All of the layers in the buffer layer 14 are typically either unintentionally doped, slightly p-type doped, or slightly n-type doped. The superlattice typically, but not necessarily, terminates on a $Al_{(x)}Ga_{(1-x)}As$ material layer.

Upon completion of the buffer layer 14, the channel and spacer layers 16 are grown. The channel is composed of $In_{(y)}Ga_{(1-y)}As$, where (y) typically ranges between 0.10 to 0.50. The thickness of the channel typically ranges between 50-200 Å. The channel layer is typically undoped and has a uniform composition. Other embodiments can include a non-uniform composition within the channel, such as a graded or stepped variation in the indium content, and intentional doping within the channel. The channel layer is formed of a narrow band gap semiconductor material. A spacer layer is disposed on either side of the channel layer.

The spacer layers are typically 15-60 Å thick and are composed of $Al_{(x)}Ga_{(1-x)}As$, with (x) ranging from 0.0 to 0.5. The spacer layers typically are undoped. In certain embodiments, $In_{(z)}Ga_{(1-z)}P$ material may be used for the spacer layers, with (z) ranging from 0.4 to 0.6. The spacer layers are composed of materials that produce a large band offset relative to the $In_{(y)}Ga_{(1-y)}As$ channel layer. The offset aids in the confinement of charge that is transferred into the channel layer. Within GaAs-based devices, the charge carriers to be transferred into the channel layer preferably are composed of electrons rather than holes. Electron mobility and velocity within the channel layer is much greater than hole mobility and velocity. Improvements in mobility and velocity are reflected by improvements in the transistor's maximum frequency of operation and gain. The presence of dopants within the channel and/or the spacer layers is generally avoided since these impurities degrade charge carrier mobility and velocity by presenting scattering sites. The scattering of charge carriers due to the presence of dopants reduces charge carrier mobility and velocity due to energy transfer and loss.

In one embodiment, silicon dopant layers, which may be one monolayer to 60 Å thick, typically are grown on one or both sides of the channel layer at the spacer layer interface opposite to the channel—spacer layer interface. The total dopant sheet carrier concentration is typically between 0.0 and 6.0E12 $cm^2$. As the growth of the epitaxial layer structure proceeds, charge from these dopant layers is transferred to the channel layer.

Upon completion of the channel and spacer layers 16, including the upper silicon dopant layer, a barrier layer 107 is grown. The barrier layer 107 is a wide band gap semiconductor material, and may be composed of $Al_{(x)}Ga_{(1-x)}As$, which can be undoped or doped with a doping level ranging from 0.0 to 1E18 $cm^{-3}$. The (x) of the $Al_{(x)}Ga_{(1-x)}As$ may range between 0.0 to 0.80. A thickness of the $Al_{(x)}Ga_{(1-x)}As$ may range between 15 to 1500 Å. A thin layer of GaAs may be incorporated on top of the $Al_{(x)}Ga_{(1-x)}As$ layer to prevent surface oxidation of high-aluminum-content $Al_{(x)}Ga_{(1-x)}As$. In certain embodiments, an $In_{(z)}Ga_{(1-z)}P$ material may be used for the barrier layer 107, with (z) ranging from 0.4 to 0.6, and a thickness ranging from 15 to 1500 Å.

An etch stop layer 109 is disposed on the upper surface of the barrier layer 107. The etch stop layer 109 may be $In_{(z)}Ga_{(1-z)}P$, with the (z) ranging between 0.4 to 0.6. This layer may be undoped or doped with a doping level ranging from 0.0 to 1E18 $cm^{-3}$. The $In_{(z)}Ga_{(1-z)}P$ material can be ordered or disordered. The thickness of the $In_{(z)}Ga_{(1-z)}P$ layer may range from 10 to 100 Å.

In embodiments where the barrier layer 107 is an $In_{(z)}Ga_{(1-z)}P$ layer, then the etch stop layer 109 may be an $Al_{(x)}Ga_{(1-x)}As$ layer, with the (x) ranging between 0.0 to 0.80, and a thickness ranging from 10 to 100 Å.

A wide recess transition layer 26 is grown on the upper surface of the etch stop layer 109. The wide recess transition layer may be composed of $Al_{(x)}Ga_{(1-x)}As$, with (x) ranging from 0.0 to 0.80. The thickness of this layer may range from 50 to 500 Å.

The ohmic contact layer 28 concludes the epitaxial layer stack of multi-layer structure 105. The ohmic contact layer may be an $In_{(y)}Ga_{(1-y)}As$ layer, where (y) ranges between 0.0 and 1.0. The thickness of this layer may range from 50 to 1000 Å. The doping level in this layer typically is as high as possible and is limited by the solid solubility of the dopant in this layer. A dopant concentration may range from 1E17 to 1E20 $cm^{-3}$.

After the provision the multi-layer structure 105, the monolithically integrated D-mode transistor 2 and E-mode transistor 103 are formed on multi-layer structure 105. Steps in an exemplary method of making the D-mode transistor 2 and the E-mode transistor 103 include: (1) forming the source and drain contacts 38, 40 on ohmic contact layer 28; (2) forming the D-mode gate recess 32 and then the D-mode gate contact 30 of the D-mode transistor 2; (3) forming the E-mode gate recess 110 and then the E-mode gate contact 111 of the E-mode transistor 103; (4) forming the respective isolation regions 6 that surround the D-mode transistor 2 and the E-mode transistor 103; (5) filling the D-mode and E-mode gate recesses 32, 110 around the D-mode and E-mode gate contacts 30, 111 with a dielectric material; and (6) forming interconnects to the source and drain contacts 38, 40 and to the D-mode and E-mode gate contacts 30, 111. The particular order of these tasks may vary and some of these steps may be combined. Wet and/or dry etch methods are used for the etch steps.

Figure 3A:
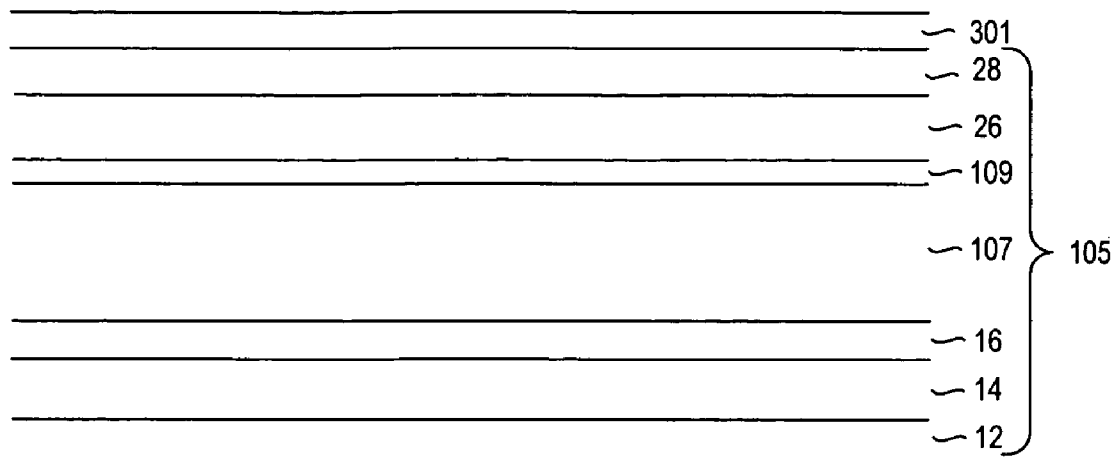
FIGS. 3A-3L are cross-sectional side views of stages in a process for making the monolithically integrated D-mode/E-mode FET device of FIG. 2.

In an exemplary process, the ohmic contact layer 90 of multi-layer substrate 105 preliminarily is overlaid with a blanket first dielectric layer 301, as shown in FIG. 3A. The dielectric layer 301 may be a layer of silicon dioxide ($SiO_2$) or silicon nitride (Si$_2$N$_3$) deposited using a plasma-enhanced chemical vapor deposition (PECVD) process.

Figure 3B:
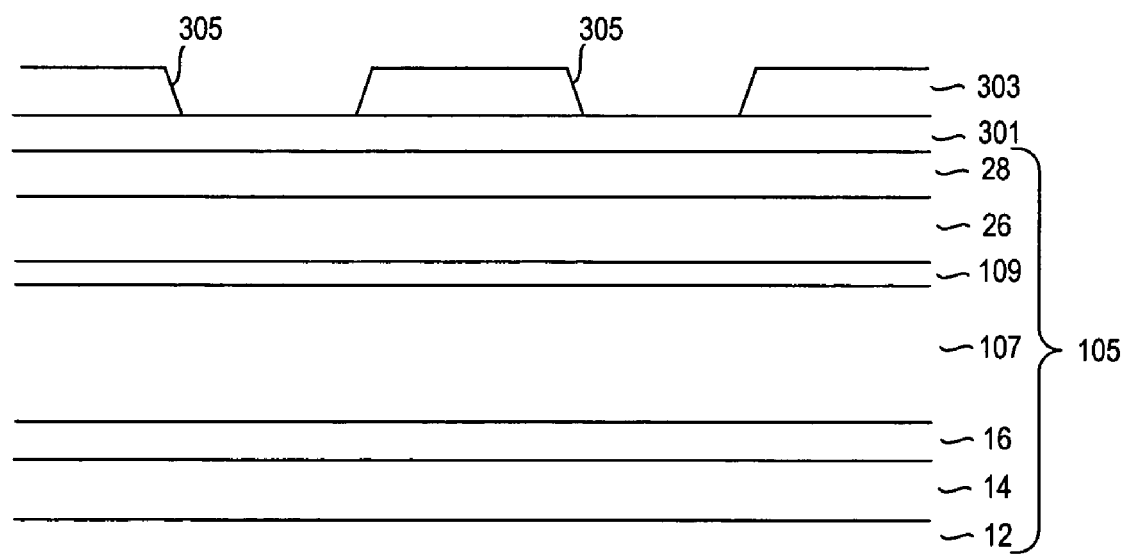
Figure 3C:
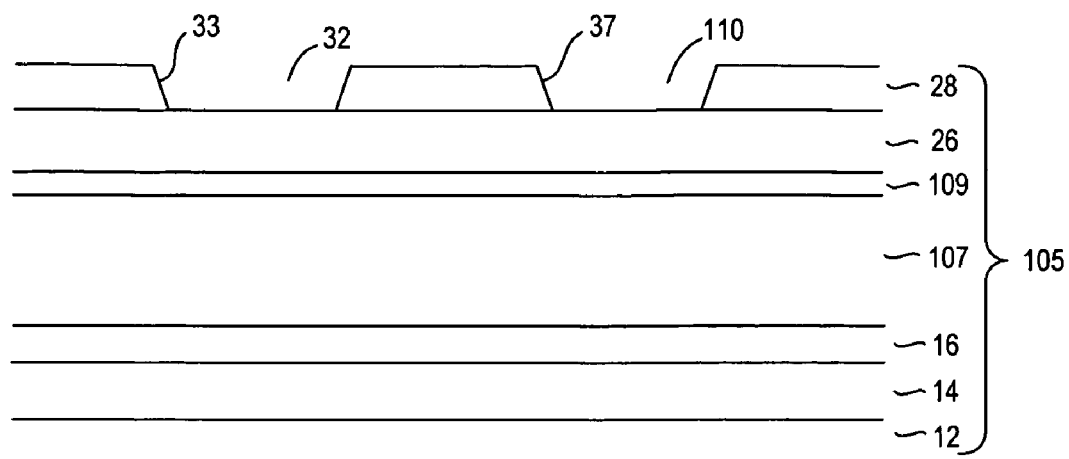

A first photoresist mask 303 then is formed over the first dielectric layer 301 using conventional lithography tools and photoresist/developer materials. As shown in FIG. 3B, the first photoresist mask 303 includes relatively large-perimeter openings 305 for forming the upper, large-perimeter portion of both the D-mode gate recess 32 and the E-mode gate recess 110. A first selective etch step etches the first dielectric layer 301 through the openings 305 in the first photoresist mask 303, and stops on ohmic contact layer 28. A second selective etch step then etches the ohmic contact layer 28 through the first photoresist mask 303 and stops on wide recess transition layer 26, thus forming the upper, large-perimeter portions of the D-mode and E-mode gate recesses 32, 110. Subsequently, the first photoresist mask 303 and the first dielectric layer 301 are stripped, resulting in the structure of FIG. 3C.

Figure 3D:
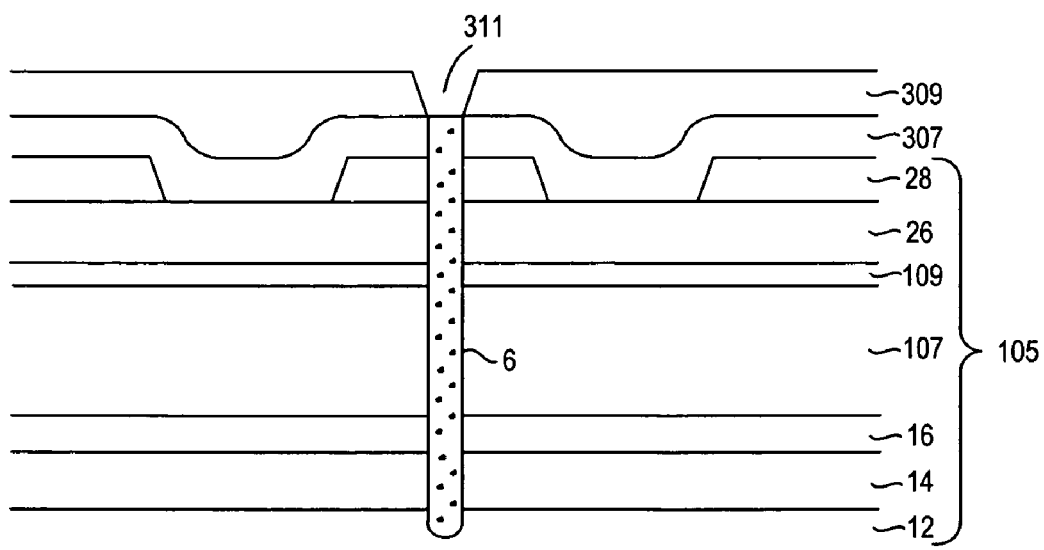

A blanket second dielectric layer 307, which may be silicon dioxide (SiO$_2$) or silicon nitride (Si$_2$N$_3$) deposited using a PECVD process, is then deposited on ohmic contact layer 26. As shown in FIG. 3D, the second dielectric layer 307 blankets the upper surface of the multi-layer substrate 5, thereby filling the partially-formed D-mode and E-mode gate recesses 32, 110 and covering the exposed upper surface of wide recess transition layer 26. Subsequently, a second photoresist mask 309 is formed on the second dielectric layer 307. The second photoresist mask 309 includes openings 311 through which ions may be implanted using conventional ion implantation equipment and techniques. The implantation step forms isolation regions 6 that enclose the respective regions where the D-mode and E-mode transistors 2, 103 will be formed. Alternatively, the D-mode and E-mode transistors 2, 103 may be isolated using conventional deep trench etch isolation methods.

Figure 3E:
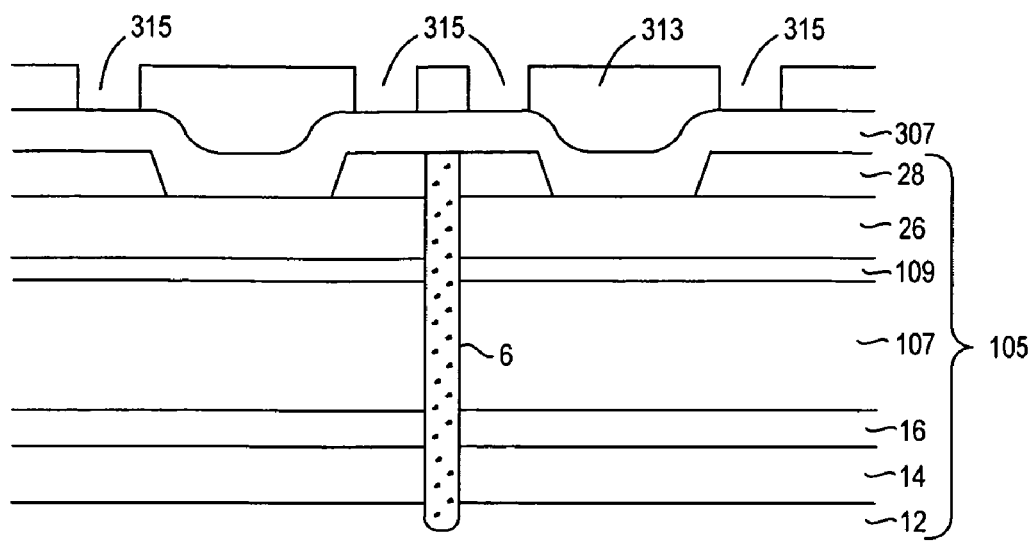
Figure 3F:
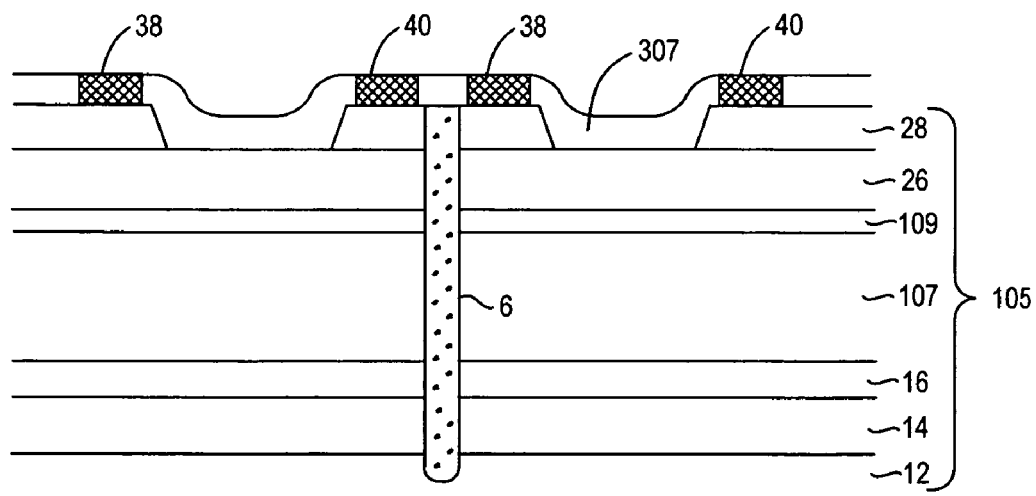

Subsequently, the second photoresist mask 309 is stripped, and a third photoresist mask 313 is formed over the second dielectric layer 307, as is shown in FIG. 3E. The third photoresist mask 313 includes openings 315 through which metal layers may be deposited to form the source and drain contacts 38, 40. The source and drain contacts 38, 40 include several successive metal layers, including: (1) a first layer of gold (Au) in contact with the upper surface of ohmic contact layer 28; (2) a second layer of nickel (Ni) on the Au layer; (3) a third layer of germanium (Ge) on the Ni layer; and (4) a fourth layer of Au on the Ge layer. A high temperature annealing process follows, which causes the metal layers of the source and drain contacts 38, 40 to intermix with the semiconductor material of ohmic contact layer 28, as is shown in FIG. 3F.

Figure 3G:
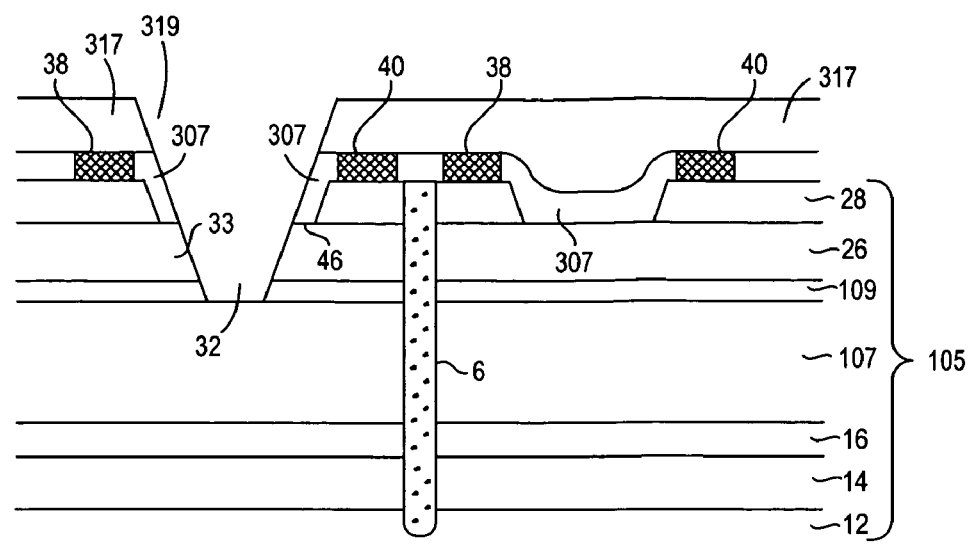

Subsequently, the third photoresist mask 313 is stripped, and a process for further forming the D-mode gate recess 2 is initiated. A fourth photoresist mask 317 is formed over the second dielectric layer 307, as is shown in FIG. 3G. The fourth photoresist mask 317 includes an opening 319 for forming the smaller-perimeter lower portion of D-mode gate recess 32. Recalling that the second dielectric layer 307 was previously deposited within the upper portion of the D-mode gate recess 32, a first selective etch step etches the second dielectric layer 307 through the opening 319 in the fourth photoresist mask 317 and re-exposes the upper surface of the wide recess transition layer 26. A second selective etch step etches the wide recess transition layer 26 through the fourth photoresist mask 317 and stops on the etch stop layer 109. With the second selective etch step, the wide recess ledge 46 is formed. The wide recess ledge 46 remains covered by a portion of the second dielectric layer 307. A third selective etch step then etches the etch stop layer 109 through the fourth photoresist mask 317 and stops on barrier layer 107. Accordingly, an upper surface of barrier layer 107 is exposed at a bottom of the tapered, stepped D-mode gate recess 32.

The D-mode gate contact 30 is formed on the exposed upper surface of the barrier layer 107 at the bottom of D-mode gate recess 32. The D-mode contact 30 includes a thin first layer of titanium that is deposited on the exposed surface of barrier layer 107 though the opening 319 in the fourth photoresist mask 317. Various other electrically conductive materials may be deposited over the initial titanium layer to complete the D-mode gate contact 30, including: tungsten (W), tungsten-silicide (WSi), gold (Au), platinum (Pd), palladium (Pd), molybdenum (Mo), iridium (Ir), tantalum (Ta), tantalum nitride (TaN), aluminum (Al), and hybrid combinations of these materials. Further titanium layers also may be included in the stack of metal layers that form D-mode gate contact 30.

Figure 3H:
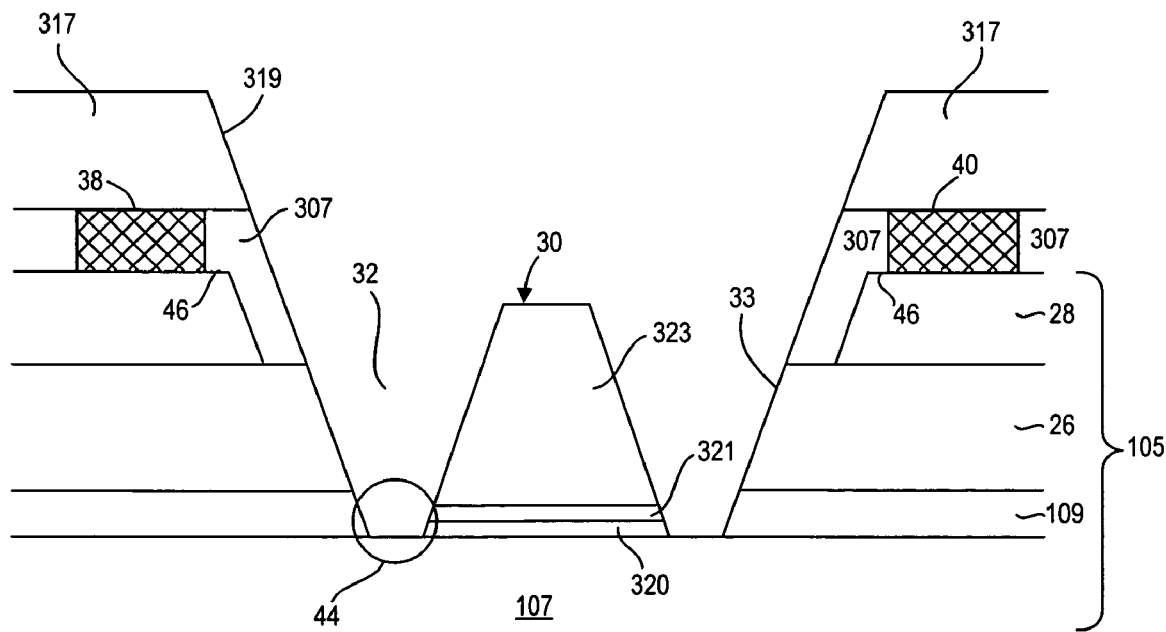

For example, as is shown in FIG. 3H, an exemplary D-mode gate contact 30 may include an initial titanium layer 320 that is deposited on the exposed upper surface of barrier layer 107 to a thickness of 50 to 1000 Å. A layer of platinum 321 having a thickness of 50 to 1000 Å is then deposited on the titanium layer 320. Finally, a gold layer 323 having a thickness of about 500 to 10,000 Å is deposited on the platinum layer 321.

The ungated region 44 of the D-mode transistor 2 may be sized differently than the ungated region 44 of the E-mode transistor 103 in order to improve breakdown characteristics.

Figure 3I:
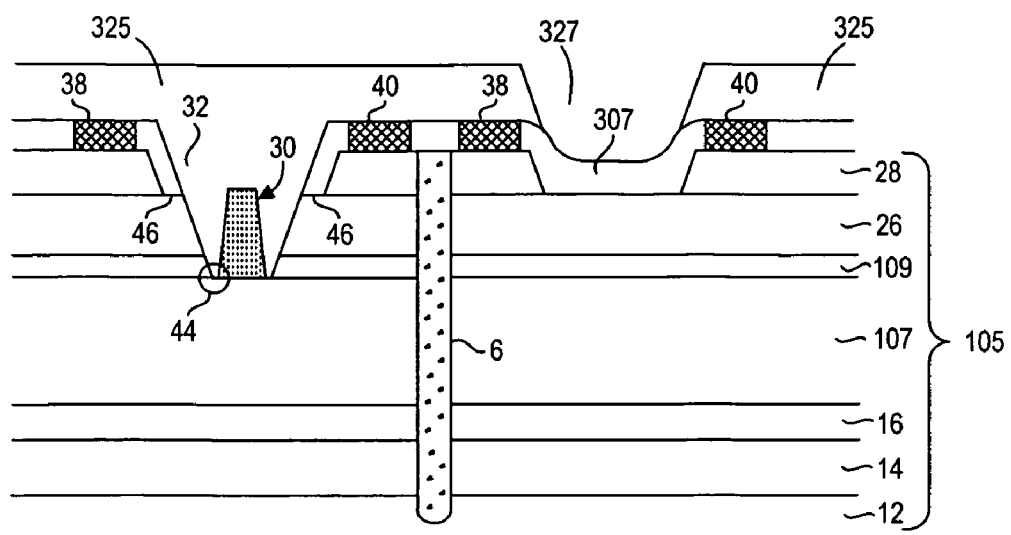
Figure 3J:
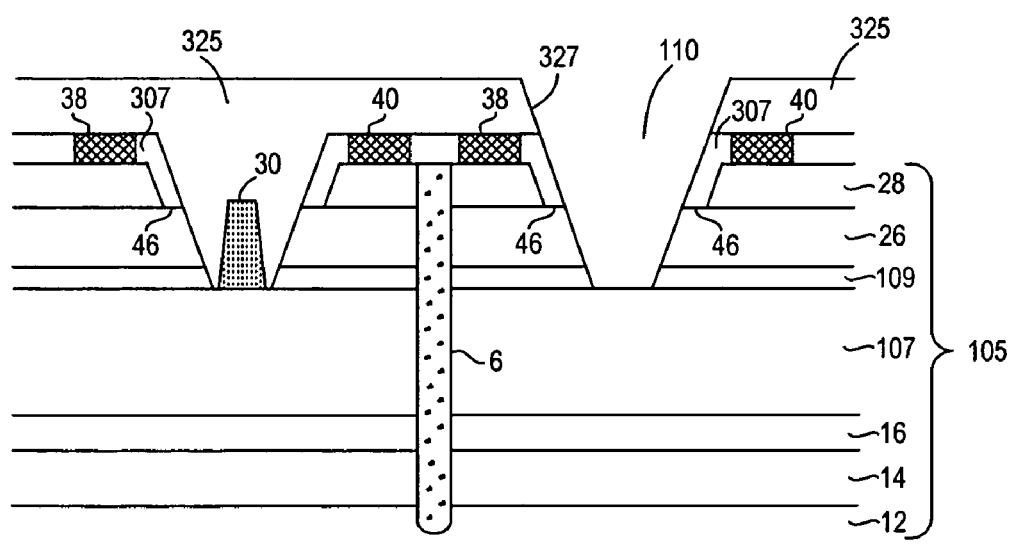

After the D-mode gate recess 32 and D-mode gate contact 30 are formed, the fourth photoresist mask 317 is stripped, and a process for further forming the E-mode gate recess 110 is initiated. Referring to FIG. 3I, a fifth photoresist mask 325 is formed over the second dielectric layer 307. The fifth photoresist mask 325 includes an opening 327 for forming the smaller-perimeter lower portion of E-mode gate recess 110. Recalling that the second dielectric layer 307 was previously deposited within the upper portion of the E-mode gate recess 110, a first selective etch step etches the second dielectric layer 307 through the opening 327 in the fifth photoresist mask 325 and re-exposes the upper surface of the wide recess transition layer 26. A second selective etch step etches the wide recess transition layer 26 through the fifth photoresist mask 325 and stops on the etch stop layer 109. With the second selective etch step, the wide recess ledge 46 is formed. The wide recess ledge 46 remains covered by a portion of the second dielectric layer 307. A third selective etch step then etches the etch stop layer 109 through the fifth photoresist mask 325 and stops on barrier layer 107. Accordingly, as is shown in FIG. 3J, an upper surface of barrier layer 107 is exposed at a bottom of the D-mode gate recess 110. Note that the process of forming the E-mode gate recess 110 requires fewer etch steps than the process described above for forming the E-mode gate recess 36 of FIG. 1, because multi-layer structure 105 of FIG. 2 includes fewer layers than multi-layer structure 5 of FIG. 1

Subsequently, the E-mode gate contact 111 is formed on the exposed surface of the barrier layer 107 at the bottom of E-mode gate recess 110. The stack of metal layers that comprise the E-mode gate contact 111 are deposited into E-mode gate recess 110 through the opening 327 in the fifth photoresist mask 325.

The metal layers deposited to form the E-mode gate contact 111 differ from those that were deposited to form the D-mode gate contact 30 of FIGS. 1 and 2, and the E-mode gate contact 34 of FIG. 1. In particular, the initial metal layer deposited on the exposed surface of the barrier layer 107 at the bottom of the E-mode gate recess 110 is selected from a group of metals that will fully amorphize with the semiconductor material of barrier layer 107 under selected process conditions, so as to form the amorphized region 113 of the monolithically integrated D-mode and E-mode FET device 101 of FIG. 2. Metals that may be used as the initial metal layer deposited on the exposed surface of the barrier layer 107 in forming E-mode gate contact 111 include, for instance, iridium (Ir), palladium (Pd), platinum (Pt), nickel (Ni), cobalt (Co), chromium (Cr), ruthenium (Ru), osmium (Os), rodium (Ro), and rhenium (Re). The subsequently-deposited layers of material used to form the remainder the E-mode gate contact 111 may be selected from electrically-conductive materials such as: tungsten (W), tungsten-silicide (WSi), titanium (Ti), gold (Au), platinum (Pd), palladium (Pd), molybdenum (Mo), iridium (Ir), tantalum (Ta), tantalum nitride (TaN), aluminum (Al), and hybrid combinations of these materials.

The solid state amorphization of the initial metal layer of the E-mode gate contact 111 into the semiconductor of barrier layer 107 (FIG. 2) involves the use of a thermal treatment in the 250 to 400 degree Celsius range. Careful control of the temperature, and time at which the device is held at this temperature, is required to ensure that the initial metal layer diffuses uniformly, consistently, and fully into the barrier layer 107, so as to form the fully amorphized region 113. This thermal treatment may be effected through a dedicated heating step, or though a subsequent step in the normal course of forming the D-mode and E-mode transistors 2, 103, e.g., a plasma-assisted dielectric deposition step that fills the D-mode and E-mode gate recesses 32, 110 after the D-mode and E-mode gate contacts 30, 111 are formed. Ideally, the amorphization of the initial platinum layer into the barrier layer 107 will produce uniform, stratified layers of electrically conductive compounds with small grain size and very little intermixing of the stratified layers in order to create repeatable and manufactureable transistors.

Figure 3K:
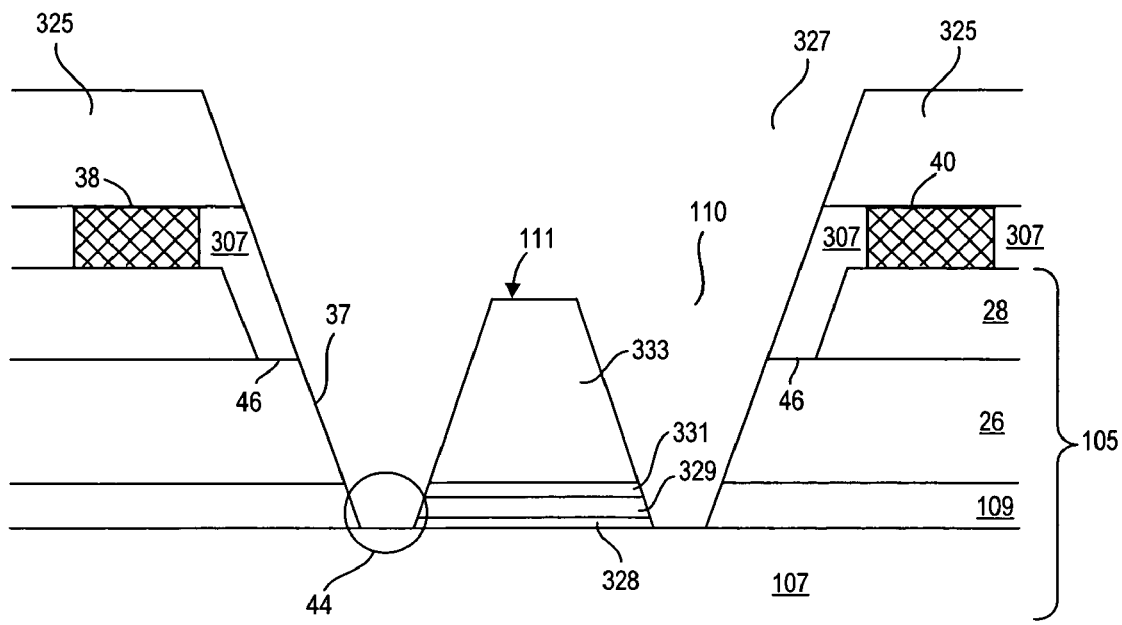

Referring to FIG. 3K, where barrier layer 107 is a layer of $Al_{(x)}Ga_{(1-x)}As$ having a thickness of 15 to 1500 Å, an exemplary method to form the E-mode gate contact 111 of FIG. 2 includes depositing an initial layer of platinum 327 on the exposed surface of the barrier layer 107. The platinum layer 327 may have a thickness of 5 to 500 Å. A titanium layer 329 having a thickness of 50 to 1000 Å is then deposited on the initial platinum layer 327. A second platinum layer 331 having a thickness of about 50 to 1000 Å is then deposited on the titanium layer 329. Finally, a gold layer 333 having a thickness of 500 to 10,000 Å is deposited on the second platinum layer. In other words, Pt—Ti—Pt—Au is the deposition sequence starting from the first layer to the last layer. After the thermal treatment, the amorphized region 113 may extend to a depth of about 10 to 1000 Å from the upper surface of barrier layer 107. Accordingly, about 5 to 500 Å of unreacted $Al_{(x)}Ga_{(1-x)}As$ of the barrier layer 107 remains below the amorphized region 113. The stratified layers of compounds forming amorphized region 113 may include layers of $PtAs_{(x)}$, where x can be between 0.5 and 2.0, and $PtGa_{(y)}$, where y can be between 0.5 and 3.0.

Within the exemplary Pt—Ti—Pt—Au structure of the E-mode gate contact 110 of FIG. 3K, the gold layer 333 tends to lower the gate resistance, which improves high frequency transistor performance. The second platinum layer 331 serves as a diffusion/intermixing barrier between the titanium and the gold layers 329, 333. The titanium layer 329 prevents the second platinum layer 331 from undergoing solid state amorphization with the semiconductor material of barrier layer 107.

In alternative embodiments, wherein the initial metal layer deposited on the barrier layer 107 in the course of forming E-mode gate contact 11 is one of the other metals listed above, e.g., iridium, palladium, nickel, cobalt, chromium, ruthenium, osmium, rodium, and rhenium, then the stratified layers of electrically-conductive compounds formed in amorphized region 113 would include the particular metal that was initially deposited on the barrier layer 107 obviously, the material selected for forming the barrier layer 107 also will determine what compounds are formed in amorphized region 113.

In an alternative embodiment, a plurality of amorphizable metal layers selected from the above-mentioned list of metals may be sequentially deposited on the barrier layer 107 as the first few layers of the E-mode gate contact 111. For instance, with reference to FIG. 3K, after the deposition of platinum layer 327 in contact with the exposed upper surface of barrier layer 107, but before the deposition of titanium layer 329, a layer of palladium may be deposited on the upper surface of platinum layer 327. The titanium layer 329 then would be deposited on the palladium layer. Through a thermal treatment, as described above, the platinum and palladium metal layers would fully amorphize into the semiconductor to form amorphized region 113, whereas the titanium layer 329 would not diffuse into the barrier layer 107. Through selection of the plural amorphizable metal layers and the thicknesses thereof, the performance of the E-mode transistor may be tuned for particular applications.

Figure 3L:
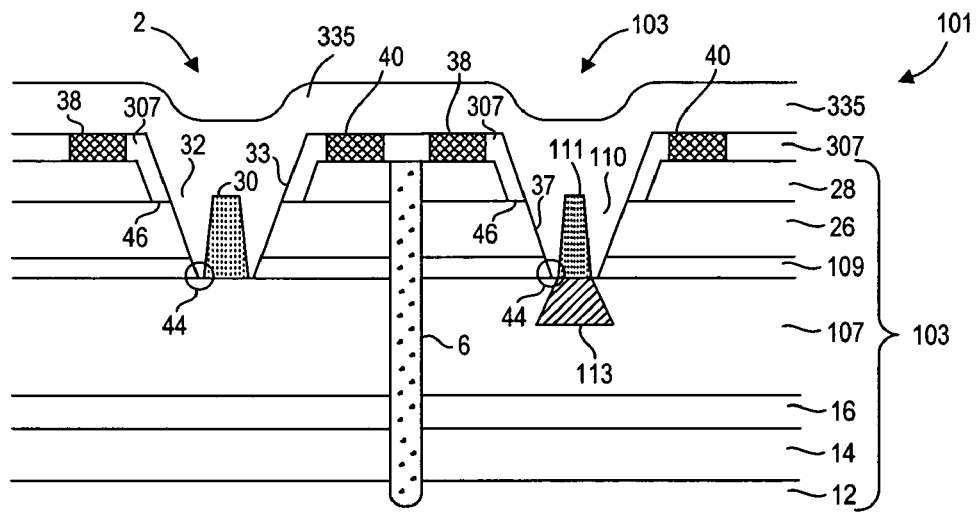

Subsequent to the formation of the E-mode gate contact 110, the fifth photoresist mask 325 is removed. Subsequently, a blanket dielectric layer 335 is deposited over the multi-layer structure 105, as is shown in FIG. 3L. The dielectric layer fills the D-mode gate recess 32 around D-mode gate contact 30, fills the E-mode gate recess 110 around E-mode gate contact 111, and covers the source and drain contacts 38, 40. For instance, the blanket dielectric layer 335 may be a layer of silicon nitride deposited using a PECVD process in the 250 to 400 degree Celsius range. As mentioned, the diffusion of the initial metal layer of the E-mode gate contact 111 into barrier layer 107 may occur during such a deposition step, thereby forming amorphized region 113. In some cases, small voids may form at the bottom of the D-mode and E-mode recesses 32, 110 in the ungated region 44 around the D-mode and E-mode gate contacts 30, 111 during the deposition of the dielectric layer 335.

Subsequent steps in the formation of the monolithically integrated D-mode and E-mode transistors 2, 103 include forming interconnects to the source and drain contacts 38, 40 and to the D-mode and E-mode gate contacts 30, 111 through the blanket dielectric layer 335. Conventional photolithography, etching, and metal deposition steps are used.

Figure 4:
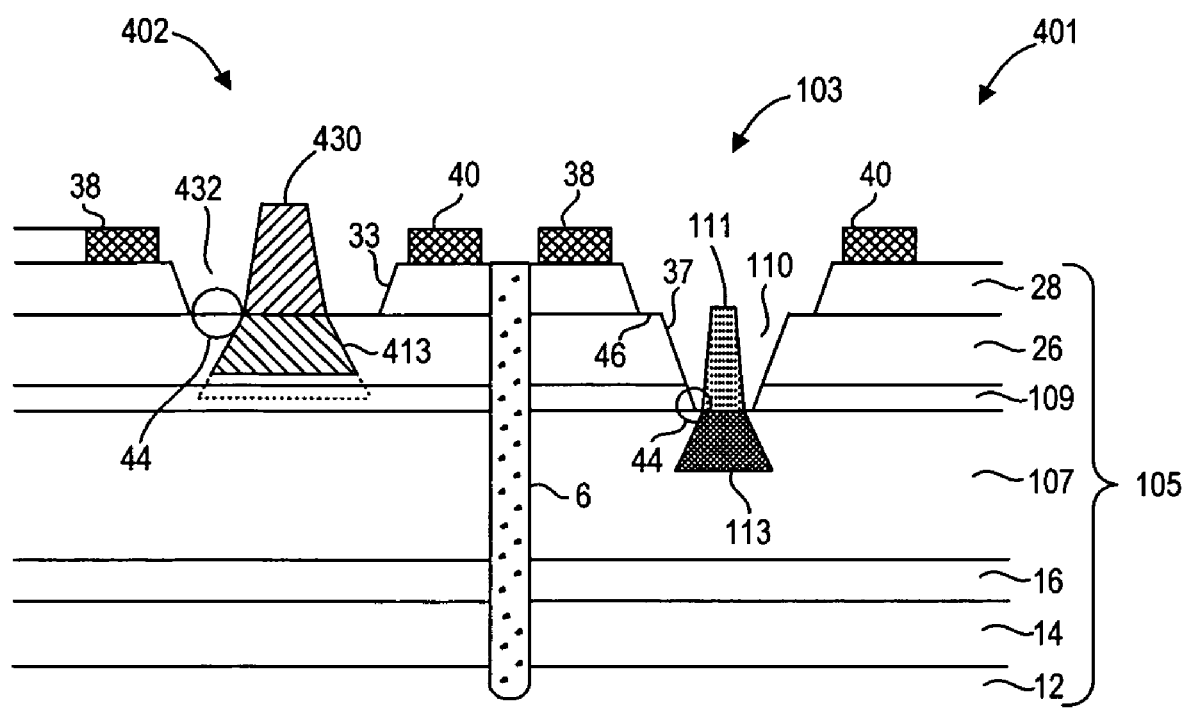
FIG. 4 is a simplified cross-sectional side view of another embodiment of a monolithically integrated D-mode/E-mode FET device in accordance with the present invention.

FIG. 4 illustrates another embodiment of a monolithically integrated D-mode and E-mode FET device 401 in accordance with the present invention. The monolithically integrated D-mode/E-mode FET device 401 is very similar to device 101 of FIG. 2, and includes many of the same reference numbers.

In the monolithically integrated D-mode/E-mode FET device 401 of FIG. 4, the D-mode gate contact 430 of the D-mode transistor 402 is formed in a manner similar to the E-mode gate contact 111 of device 101 of FIG. 2, in that material deposited to form the D-mode gate contact 430 is diffused into the upper surface of wide recess transition layer 26 of multi-layer substrate 105, forming a D-mode amorphization region 413 beneath the D-mode gate contact 430. The D-mode amorphization region 413 may have a lowermost portion that is entirely within wide recess transition layer 26 (as is shown by a solid line), or may have a lowermost portion that extends into the underlying etch stop layer 109 (as is shown by a dash line). The depth of the D-mode amorphization region 413, which is controlled in large part by the thickness of the initial layer of metal deposited to form the D-mode gate contact 430, is selected to achieve desired transistor performance. In a possible alternative embodiment, the amorphization region 413 may extend to barrier layer 107.

The monolithically integrated D-mode/E-mode FET device 401 of FIG. 4 may be formed by slightly modifying the process described above for making device 101 of FIG. 2. Referring to FIGS. 3F and 3G, the fourth photoresist mask 317 is deposited over the second dielectric layer 307. A first selective etch step etches the second dielectric layer 307 through the opening 319 in the fourth photoresist mask 317, thereby forming the D-mode gate recess 432 and exposing the upper surface of the wide recess transition layer 26. However, the subsequent etch steps that produce the structure of FIG. 3G are omitted. The D-mode gate contact 430 is then formed within D-mode gate recess 432 on the exposed upper surface of wide recess transition layer 26 by the deposition of successive metal layers through opening 319 in the fourth photoresist mask 317.

Similar to E-mode gate contact 111 of FIGS. 2 and 3K, the D-mode gate contact 430 of FIG. 4 may be formed by depositing an initial metal layer (or layers) on the exposed surface of the wide recess transition layer 26 that is (or are) selected from a group of metals that will fully amorphize into the semiconductor material of wide recess transition layer 26 (and optionally into etch stop layer 65) under selected process conditions, so as to form the D-mode amorphized region 413 of the D-mode transistor 402. Metals that may be used as the initial metal layer(s) deposited on the exposed surface of the wide recess transition layer 26 in forming the D-mode gate contact 430 include, for instance, iridium (Ir), palladium (Pd), platinum (Pt), nickel (Ni), cobalt (Co), chromium (Cr), ruthenium (Ru), osmium (Os), rodium (Ro), and rhenium (Re). A diffusion/intermixing barrier layer such as titanium is deposited over the to-be-amorphized initial metal layer(s). The subsequently-deposited layers of material used to form the remainder the E-mode gate contact 111 may be selected from electrically conductive materials such as: tungsten (W), tungsten-silicide (WSi), titanium (Ti), gold (Au), platinum (Pd), palladium (Pd), molybdenum (Mo), iridium (Ir), tantalum (Ta), tantalum nitride (TaN), aluminum (Al), and hybrid combinations of these materials.

As with the method for forming the E-mode gate contact 111, the solid state amorphization of the initial metal layer of the D-mode gate contact 430 into the semiconductor of wide recess transition layer 26 involves the use of a thermal treatment in the 250 to 400 degree Celsius range. Such a thermal treatment may be accomplished though a dedicated heating step, or though subsequent processes in the course making of the transistors. For instance, the thermal treatment may be effected during the course of a PECVD process that deposits a silicon nitride layer to fill the D-mode and E-mode gate recesses 432, 110. As stated above, care should be taken so that the initial metal layer deposited in the course of making the D-mode gate contact 430 becomes fully amorphized into the semiconductor. The D-mode and E-mode amorphized regions 413, 113 may be formed simultaneously in a single thermal treatment, or one may be formed before the metal of the other gate contact is deposited.

In an embodiment where the etch stop layer 109 and the wide recess transition layers are $Al_{(x)}Ga_{(1-x)}As$ layers of slightly different compositions, as discussed above, then the D-mode gate contact 430 of FIG. 4 may be formed by initially depositing a layer of platinum on the exposed surface of wide recess transition layer 26 at the bottom of D-mode gate recess 432. This first platinum layer may have a thickness of 5 to 500 Å. A titanium layer having a thickness of 50 to 1000 Å is then deposited on the initial platinum layer. A second platinum layer having a thickness of 50 to 1000 Å is then deposited on the titanium layer. Finally, a gold layer having a thickness of 500 to 10,000 Å is deposited on the second platinum layer. In other words, Pt—Ti—Pt—Au is the deposition sequence starting from the first layer to the last layer of the D-mode gate contact 430. The diffusing of the initial platinum layer of the D-mode gate contact 430 into the wide recess transition layer 26 (an optionally into etch stop layer 109) forms stratified layers of electrically conductive compounds, such as layers of $PtAs_{(x)}$, where x can be between 0.5 and 2.0, and $PtGa_{(y)}$, where y can be between 0.5 and 3.0.

A feature of the monolithically integrated D-mode/E-mode FET device 401 of FIG. 4 is that, for both the D-mode transistor 402 and the E-mode transistor 103, the interface between the amorphized regions 413, 113 and the underlying semiconductor material of the multi-layer substrate 405 is buried. Therefore, the detrimental surface effects that may be expected to arise from the ungated region 44 and the D-mode and E-mode gate recess sidewalls 33, 37 are much reduced, enabling robust and repeatable D-mode and E-mode transistors 402, 103 to be realized.

Figure 5A:
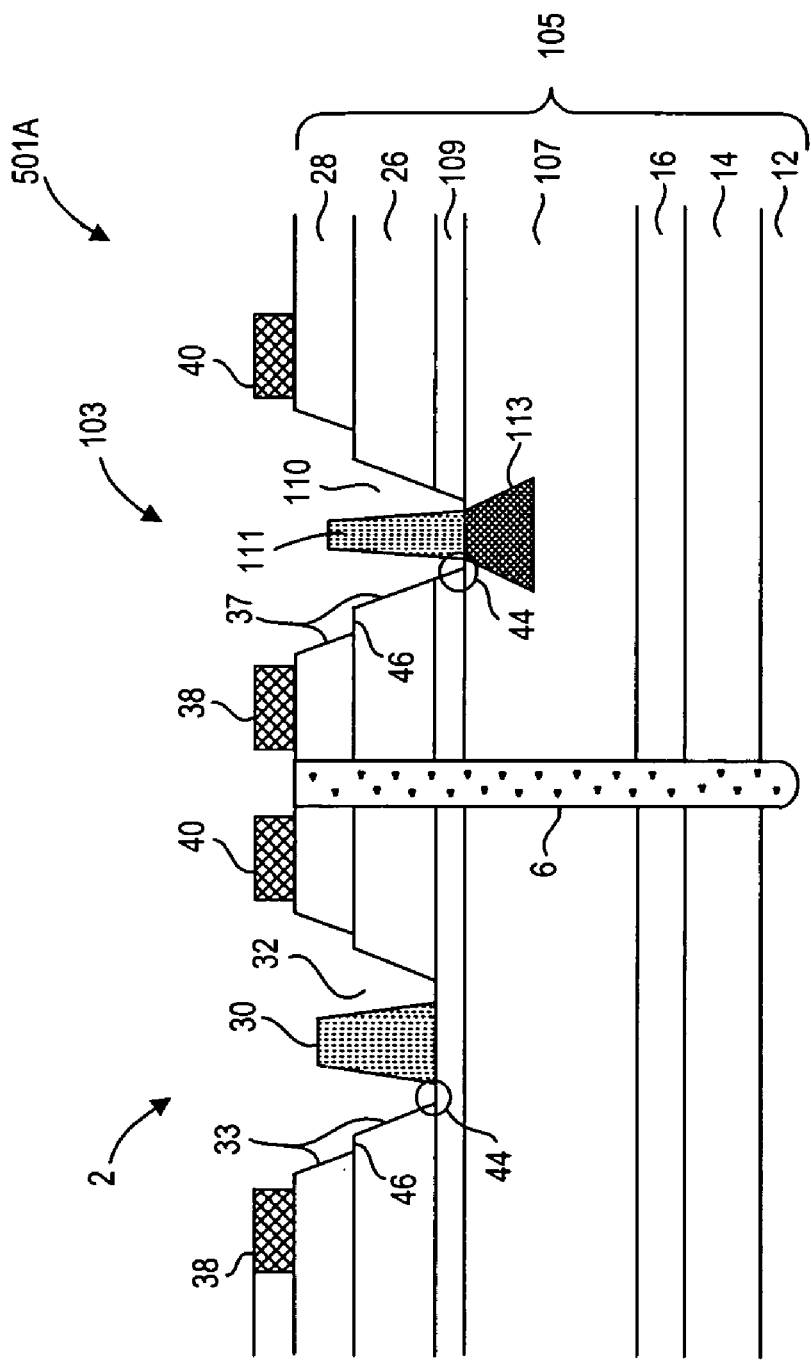
FIGS. 5A-5C are simplified cross-sectional side views of other embodiments of a monolithically integrated D-mode/E-mode device in accordance with the present invention.
Figure 5B:
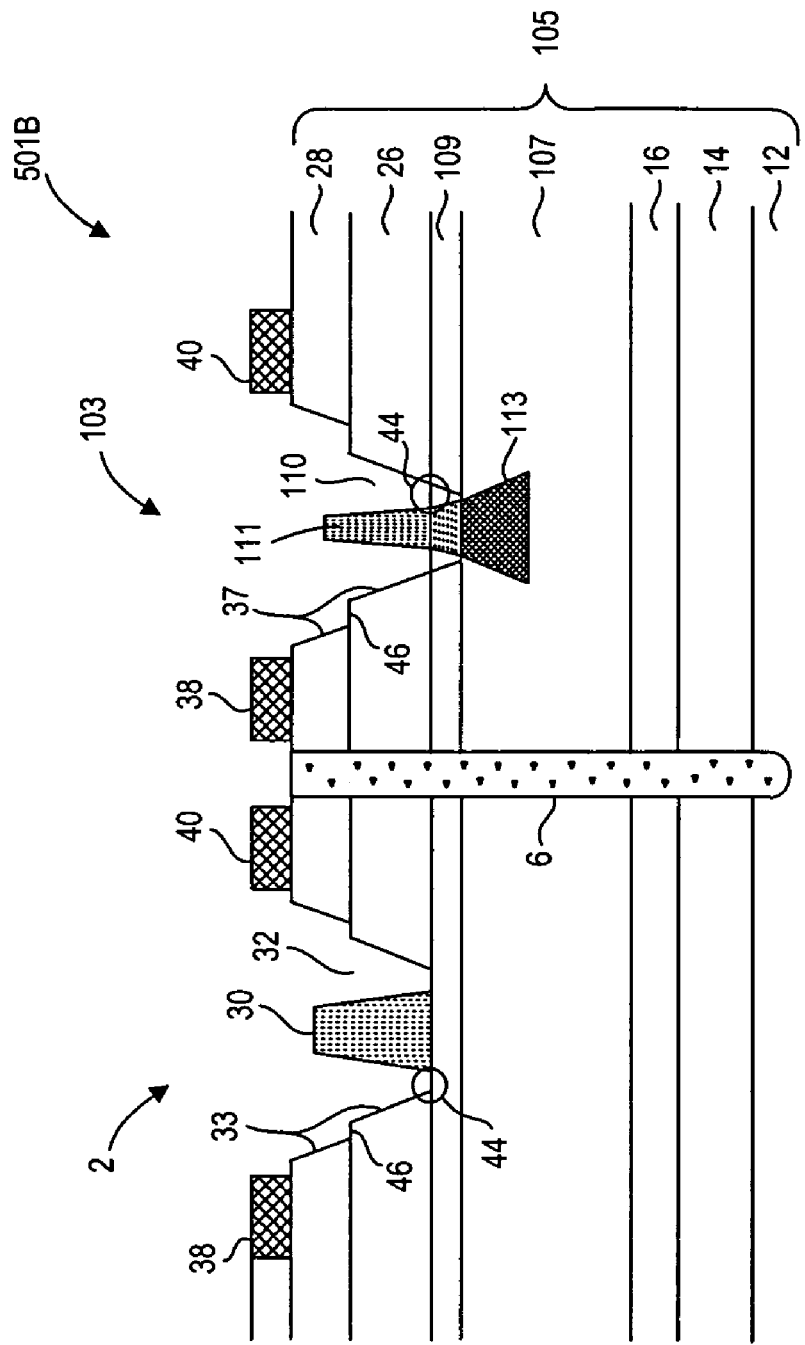
Figure 5C:
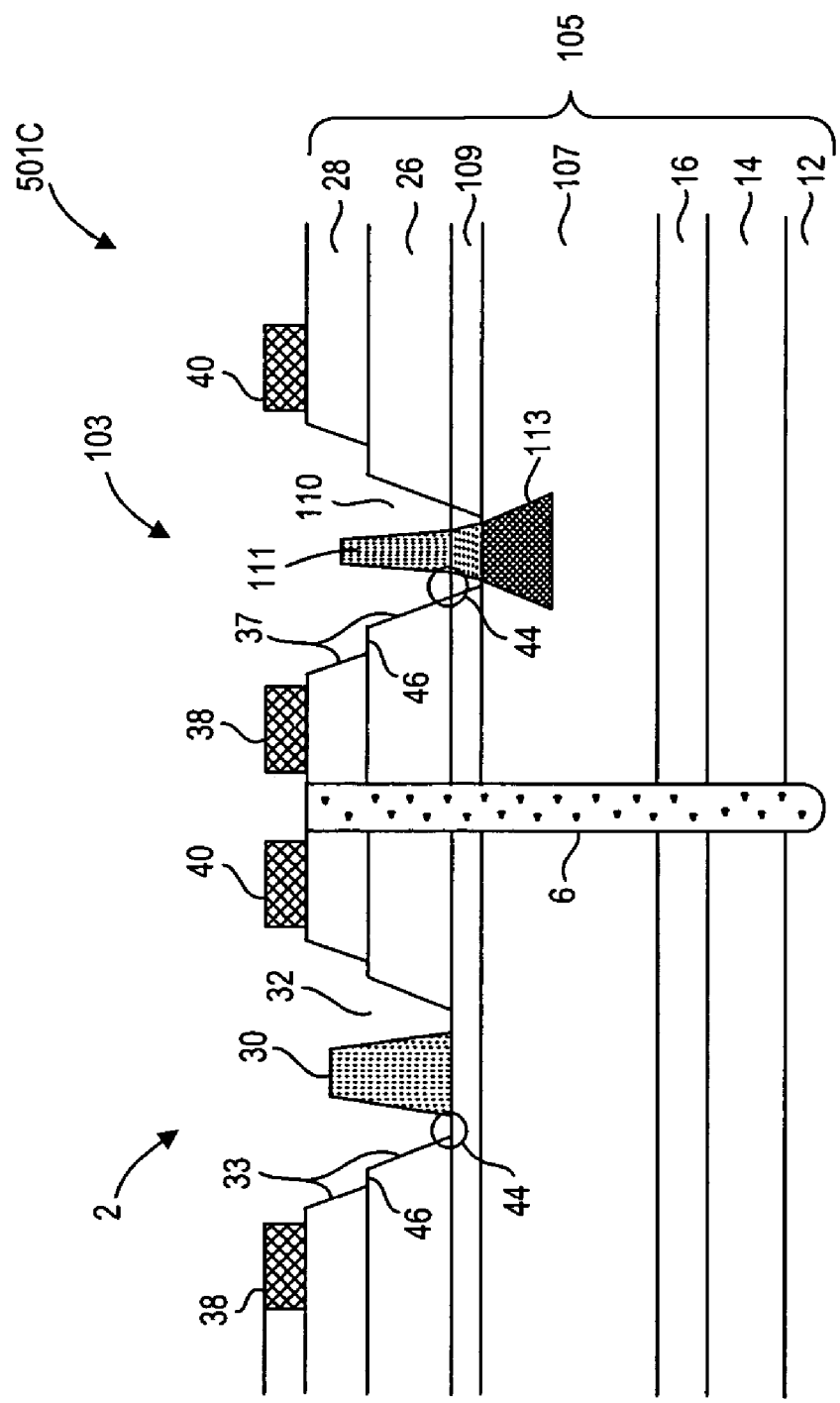

FIGS. 5A-5C illustrate other monolithically integrated D-mode and E-mode FET devices 501A-501C, respectively, in accordance with the present invention. The monolithically integrated D-mode/E-mode FET devices 501A-501C are very similar to device 101 of FIG. 2, and includes many of the same reference numbers. Our discussion can therefore focus on the differences between D-mode/E-mode FET devices 501A-501C and D-mode/E-mode FET device 101 of FIG. 2.

Referring to FIG. 5A, D-mode gate contact 30 is coupled to an exposed upper surface of etch stop layer 109, which is intact over barrier layer 107, rather than to barrier layer 107 itself as in FIG. 1. Referring to FIG. 5B, E-mode gate contact 111 is coupled to an exposed upper surface of etch stop layer 109, which is intact over barrier layer 107, rather than to barrier layer 107 itself as in FIG. 1. Amorphization region 113 extends through etch stop layer 109 and into barrier layer 107. Referring to FIG. 5C, both the D-mode gate contact 30 and the E-mode gate contact 111 are coupled to an exposed upper surface of etch stop layer 109, which is intact over barrier layer 107, rather than to barrier layer 107 itself as in FIG. 1. Fabrication of the D-mode/E-mode FET devices 501A-501C therefore entails omitting the step of etching through etch stop layer 109 in the course of forming the D-mode gate recess 32 and/or the E-mode gate recess 110. Forming the gate contacts 30, 111 on the etch stop layer 109 rather that the barrier layer 107 will alter the electrical properties of the transistors, in ways that may be desirable for certain applications.

Figure 6:
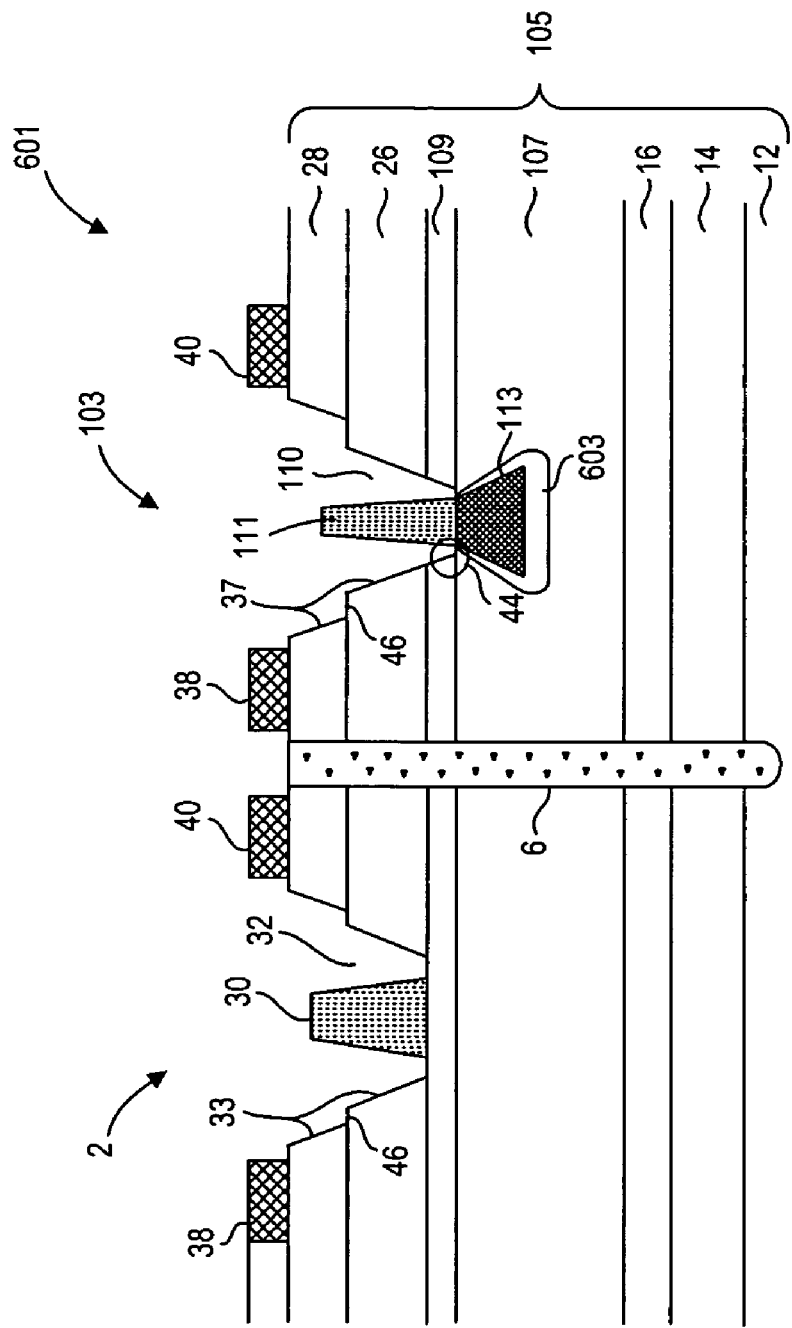
FIG. 6 is a simplified cross-sectional side view of another embodiment of a monolithically integrated D-mode/E-mode FET device in accordance with the present invention.

FIG. 6 illustrates another embodiment of a monolithically integrated D-mode and E-mode FET device 601 in accordance with the present invention. The monolithically integrated D-mode/E-mode FET device 601 is very similar to device 101 of FIG. 2, and includes many of the same reference numbers. In device 601, an ion implant region 603 is formed in barrier layer 107 after the formation of E-mode gate recess 110 but prior to the deposition of the initial metal layer of the E-mode gate contact 111. For instance, if the barrier layer 107 in doped to be N-type, the implant region 603 is P-type. After the deposition of the metal layers of the E-mode gate contact 111, and after the thermal treatment mentioned above, amorphization region 113 forms within (fully or at least partially within) the tear-drop-shaped implant region 603. Such a design may have improved performance, e.g., with respect to leakage currents.

FIG. 7 illustrates another embodiment of a monolithically integrated D-mode and E-mode FET device 701 in accordance with the present invention. The monolithically integrated D-mode/E-mode FET device 401 is similar to device 101 of FIG. 2, and includes many of the same reference numbers. A difference between the embodiments is that the multi-layer substrate 705 of device 701 includes fewer epitaxial semiconductor layers than multi-layer substrate 105 of device 101. In particular, the multi-layer substrate 705 includes a semiconductor substrate 12, overlaid by a channel and spacer layer 16, overlaid by a barrier layer 107. The spacer layer(s) and barrier layer 107 are formed of a wide band gap semiconductor material. The channel layer is formed of a narrow band gap semiconductor material.

The source and drain contacts 38, 40 of the D-mode transistor 702 and the E-mode transistor 703 of device 701 formed on an upper surface of barrier layer 107. A high temperature annealing process follows, which causes the metal layers of the source and drain contacts 38, 40 to intermix with the underlying semiconductor material, thereby forming a intermixed region 707 that extends through channel and spacer layer 16. Alternatively, an ion implant step may be performed prior to the deposition of the metal layers of source and drain contacts 38, 40, so that an implantation region is present beneath the source and drain contacts 38, 40.

The D-mode gate contact 30 and the E-mode gate contact 111 also are formed on the upper surface of barrier layer 107. The E-mode gate contact 111 is formed to have an initial metal layer (or layers) that will diffuse into barrier layer 107 upon a heat treatment, so as to form an amorphization region 113 within the barrier layer 107, thereby forming a buried Schottky contact. For instance, the E-mode gate contact 111 may be formed with an initial platinum layer 328, which is overlaid by a titanium layer 329.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by practitioners in view of this disclosure.

I claim:

1. A method of making an integrated circuit including a D-mode FET and an E-mode FET, the method comprising:
providing a multi-layer structure comprising a semiconductor substrate overlaid with a plurality of epitaxial semiconductor layers, including a channel layer overlaid by a barrier layer overlaid by an etch stop layer, wherein the channel, etch stop and barrier layers are common to the D-mode and the E-mode FETs;
forming respective source and drain contacts for the D-mode FET and E-mode FET on one of the epitaxial layers of the multi-layer structure;
forming a gate recess in the multi-layer structure for the D-mode FET, and a gate recess in the multi-layer structure for the E-mode FET, wherein a surface of the barrier layer is exposed at a bottom of both the D-mode and E-mode gate recesses; and
depositing a plurality of metal layers onto the exposed surface of the barrier layer within the D-mode and E-mode gate recesses, thereby forming a D-mode gate contact and an E-mode gate contact on the barrier layer, wherein the E-mode gate contact forms a Schottky contact with the barrier layer,
wherein a first metal layer deposited in contact with the barrier layer in the D-mode gate recess is different than a first metal layer deposited in contact with the barrier layer in the E-mode gate recess.

2. The method of claim 1, further comprising:
fully amorphizing the first metal layer deposited in contact with the barrier layer in the E-mode gate recess into the barrier layer, wherein the first metal layer deposited in contact with the exposed surface of the barrier layer in the D-mode gate recess is not significantly amorphized into the barrier layer.

3. The method of claim 2, wherein the first metal layer deposited in contact with the exposed surface of the barrier layer in the E-mode gate recess comprises one of platinum, iridium, palladium, nickel, cobalt, chromium, ruthenium, osmium rodium, and rhenium, and the first metal layer deposited in contact with the barrier layer in the D-mode gate recess is not one of iridium, palladium, nickel, cobalt, chromium, ruthenium, osmium rodium, and rhenium.

4. The method of claim 2, wherein the barrier layer is of a first conductivity type; and
further comprising forming an implant region of a second conductivity type at least in the barrier layer beneath the E-mode gate contact,
wherein the first metal layer of the E-mode gate contact is amorphized into the implant region.

5. The method of claim 1, wherein the first metal layer deposited in contact with the exposed surface of the barrier layer in the E-mode gate recess comprises one of platinum, iridium, palladium, nickel, cobalt, chromium, ruthenium, osmium rodium, and rhenium; and further comprising:
depositing a second metal layer on the E-mode first metal layer, wherein the second metal layer is a different one of platinum, iridium, palladium, nickel, cobalt, chromium, ruthenium, osmium rodium, and rhenium than the first metal layer; and
fully amorphizing second metal layer of the E-mode gate contact into the barrier layer.

6. A method of making an integrated circuit including a D-mode FET and an E-mode FET, the method comprising:
providing a multi-layer structure comprising a semiconductor substrate overlaid with a plurality of epitaxial semiconductor layers, including at least a channel layer overlaid by a barrier layer overlaid by an etch stop layer, wherein at least the channel, etch stop and barrier layers are common to the D-mode and the E-mode FETs;
forming respective source and drain contacts for the D-mode FET and E-mode FET on the multi-layer structure over the barrier layer;
forming a gate recess in the multi-layer structure for the E-mode FET, wherein a surface of the barrier layer is exposed at a bottom of the E-mode gate recess;
depositing a plurality of metal layers onto the multi-layer structure to form a D-mode gate contact on the barrier layer;
depositing a plurality of metal layers onto the exposed surface of the barrier layer within the E-mode gate recess, thereby forming an E-mode gate contact on the barrier layer, wherein the plurality of metal layers includes a first metal layer in contact with the exposed surface of the barrier layer, and wherein the E-mode gate contact forms a Schottky contact with the barrier layer; and
fully amorphizing the first metal layer of the E-mode gate contact into the barrier layer, wherein a first metal layer of the D-mode gate contact that was deposited in contact with the multi-layer structure is not significantly amorphized into the multi-layer structure.

7. The method of claim 6, further comprising:
forming a gate recess in the multi-layer structure for the D-mode FET, wherein a surface of the barrier layer is exposed at a bottom of the D-mode gate recess, wherein the first metal of the D-mode gate contact is in contact with the barrier layer.

* * * * *